(12) United States Patent
Komatsu et al.

(10) Patent No.: US 11,967,358 B2
(45) Date of Patent: Apr. 23, 2024

(54) APPARATUSES AND METHODS FOR BIAS TEMPERATURE INSTABILITY MITIGATION

(71) Applicant: MICRON TECHNOLOGY, INC., Boise, ID (US)

(72) Inventors: Yoshiya Komatsu, Kanagawa (JP); Yutaka Uemura, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 121 days.

(21) Appl. No.: 17/825,600

(22) Filed: May 26, 2022

(65) Prior Publication Data

US 2023/0386555 A1 Nov. 30, 2023

(51) Int. Cl.
*G11C 11/4076* (2006.01)
*G11C 11/4074* (2006.01)
*G11C 11/4093* (2006.01)

(52) U.S. Cl.
CPC ...... *G11C 11/4076* (2013.01); *G11C 11/4074* (2013.01); *G11C 11/4093* (2013.01)

(58) Field of Classification Search
CPC ............ G11C 11/4076; G11C 11/4074; G11C 11/4093
USPC ........................................ 365/185.18, 189.05
See application file for complete search history.

(56) References Cited

U.S. PATENT DOCUMENTS

| | | | | |
|---|---|---|---|---|
| 10,447,267 B1 * | 10/2019 | Waldrop | ............... | H03K 19/003 |
| 2004/0145423 A1 * | 7/2004 | Kirsch | ................... | H03K 5/135 |
| | | | | 331/57 |
| 2007/0143384 A1 * | 6/2007 | Muranaka | ............... | G06F 7/588 |
| | | | | 708/250 |
| 2009/0319202 A1 * | 12/2009 | Gebara | ............ | G01R 31/31725 |
| | | | | 702/42 |
| 2012/0147692 A1 * | 6/2012 | Nakamura | .......... | G11C 11/4076 |
| | | | | 327/145 |
| 2012/0155212 A1 * | 6/2012 | Kodama | ............... | G11C 7/1042 |
| | | | | 365/233.14 |
| 2013/0015876 A1 * | 1/2013 | Lai | ...................... | G01R 31/2642 |
| | | | | 324/762.01 |
| 2013/0117582 A1 * | 5/2013 | Satyamoorthy | ......... | G06F 1/324 |
| | | | | 713/300 |
| 2013/0117589 A1 * | 5/2013 | Satyamoorthy | ....... | G06F 1/3296 |
| | | | | 713/320 |
| 2015/0048894 A1 * | 2/2015 | Ma | ....................... | H03K 3/0315 |
| | | | | 331/1 A |
| 2015/0212149 A1 * | 7/2015 | Smith | ................ | G01R 31/2851 |
| | | | | 324/762.01 |

(Continued)

FOREIGN PATENT DOCUMENTS

| | | | | |
|---|---|---|---|---|
| EP | 4123648 A1 * | 1/2023 | ......... | G11C 11/4093 |
| JP | 2012129851 A * | 7/2012 | ....... | G11C 11/40615 |
| KR | 883140 B1 * | 2/2009 | ........... | G11C 7/1051 |

*Primary Examiner* — Michael T Tran
(74) *Attorney, Agent, or Firm* — Dorsey & Whitney LLP

(57) ABSTRACT

Apparatuses, systems, and methods for bias temperature instability (BTI) mitigation. A BTI oscillator provides a periodic BTI signal. A BTI logic circuit generates a BTI pulse signal based on the periodic BTI signal and synchronized to a clock signal. A clock gating circuit passes the clock signal to a clock path when the periodic BTI signal is active. When the memory is in an unclocked mode, where an external clock is not received, the periodic BTI signal is provided to a clock input buffer and passed as the clock signal.

19 Claims, 10 Drawing Sheets

(56) References Cited

U.S. PATENT DOCUMENTS

| | | | | |
|---|---|---|---|---|
| 2015/0310152 | A1* | 10/2015 | Berkovitz | H03K 3/0375 |
| | | | | 716/113 |
| 2016/0341785 | A1* | 11/2016 | Balakrishnan | G01R 31/2642 |
| 2017/0346492 | A1* | 11/2017 | Jenkins | H03K 3/0315 |
| 2018/0062629 | A1* | 3/2018 | Ma | H03K 5/15013 |
| 2018/0276035 | A1* | 9/2018 | Henry | G06F 9/4812 |
| 2019/0066741 | A1* | 2/2019 | Lee | G11C 7/222 |
| 2019/0095571 | A1* | 3/2019 | Cheng | G06F 30/394 |
| 2019/0137563 | A1* | 5/2019 | Kwon | G01R 31/2621 |
| 2019/0265293 | A1* | 8/2019 | Fifield | G01R 31/2642 |
| 2019/0267062 | A1* | 8/2019 | Tan | G11C 29/023 |
| 2019/0333552 | A1* | 10/2019 | Hong | G11C 7/109 |
| 2020/0287527 | A1* | 9/2020 | Kim | H03K 5/06 |
| 2020/0393506 | A1* | 12/2020 | Landman | G01R 31/31937 |
| 2022/0383930 | A1* | 12/2022 | Gajapathy | G06F 1/3209 |
| 2023/0038670 | A1* | 2/2023 | Narasimhan | G06F 9/30134 |
| 2023/0058318 | A1* | 2/2023 | Yallamaraju | H03K 5/1565 |
| 2023/0198533 | A1* | 6/2023 | Gruber | H03M 1/687 |
| | | | | 341/136 |
| 2023/0206986 | A1* | 6/2023 | Mochida | G11C 11/4074 |
| | | | | 365/233.1 |

\* cited by examiner

APPARATUSES AND METHODS FOR BIAS TEMPERATURE INSTABILITY MITIGATION

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). When accessed, the memory cell may be coupled to a digit line (or bit line), and a voltage on the digit line may change based on the information stored in the coupled memory cell.

Bias temperature instability (BTI), such as negative bias temperature instability (NBTI) and positive bias temperature instability (PBTI) may cause degradation in a transistor where a voltage is applied to the gate of the transistor for a long time. Access operations in a memory may be synchronized to a clock signal, which may rapidly cycle between a positive and negative level. The transistors coupled to such signals may need to have their gate voltages periodically toggled to mitigate BTI. However, it may be necessary to control the BTI toggle signal to prevent conflicts between the BTI toggle and access operations.

DETAILED DESCRIPTION

Figure 1:
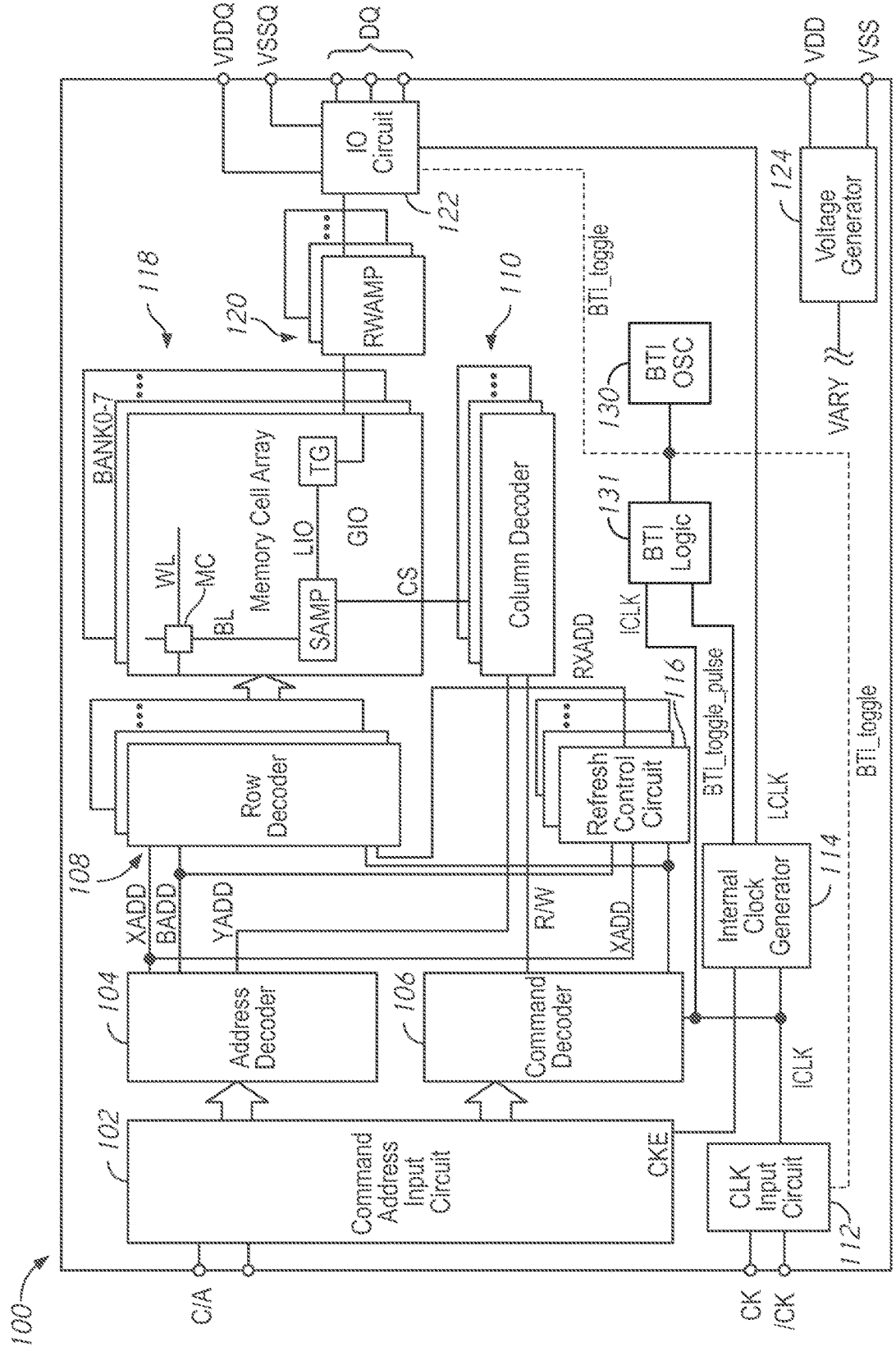
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Memory arrays may generally include a number of memory cells arranged at the intersection of word lines (rows) and bit lines/digit lines (columns). During a read operation, the memory may receive a read command and row and column addresses which indicate which memory cell(s) data should be read from. The data is provided to output buffers, and read off from input/output (DQ) pads of the memory. Operations may be synchronized to a clock signal. A data path includes a number of latches which latch commands, addresses, and/or data and provide it in synchronization with a clock signal. A clock path may receive a clock signal and distribute it through the memory to the data latches. The transistors along the clock and data path may be particularly susceptible to BTI degradation due to the rapid oscillation of the clock signal they receive during operations.

The memory includes BTI logic which provides a periodic BTI signal. The periodic BTI signal may be generated by a BTI oscillator. The periodic BTI signal may be provided to the data path when the system is in a standby mode. The periodic BTI signal may also be provided to the clock path, however this may lead to complications since the clock path must be able to rapidly transition to the clock signal when the memory leaves a standby mode. There is a need to control the application of the BTI toggle signal to the clock path so that the BTI toggle signal does not interfere with a resumption of operations. It may also be useful to account for unclocked memory modes where an external clock signal is not used.

The present disclosure is drawn to apparatuses, systems, and methods for bias temperature instability mitigation. The memory includes a BTI oscillator which provides a periodic BTI signal. The memory includes BTI logic which generates a BTI pulse signal which is synchronized to the clock signal based on the periodic BTI signal. The BTI pulse signal is provided to a clock gating circuit. The clock gating circuit provides the clock signal to the clock path responsive to a received command or responsive to the BTI pulse signal. Since the BTI pulse signal is in synchronization with the clock signal and is used to control a clock gating circuit, the pulses passed to the clock path responsive to the BTI pulse signal are the same timing and waveform as in normal operations, so toggling the clock on (e.g., when a command is received) does not cause a glitch with the BTI pulse signal.

In some embodiments, the memory may include clock toggle logic which is used when the memory is an unclocked operational mode where an external clock is not provided. For example, when the memory is in an unclocked mode, the periodic BTI signal is coupled to an input of a clock input buffer to become the clock signal and the BTI logic may be suppressed (as it is not needed when the BTI toggle signal is already the clock signal) and the clock gating circuit may be opened (e.g., by setting the BTI pulse signal to an active level). In addition, during an unclocked mode, the periodic BTI signal may be provided to the data path when the memory is in an unclocked mode.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments.

Each memory bank includes a plurality of word lines WL, a plurality of bit lines BL, and a plurality of memory cells MC arranged at intersections of the plurality of word lines WL and the plurality of bit lines BL. The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. In some embodiments, components such as the row and column decoders and refresh control circuit 116 which are repeated on a per-bank basis may also include components which are repeated on a per-sub-bank basis. For example, there may be a refresh control circuit 116 for each sub-bank.

The bit lines BL are coupled to a respective sense amplifier (SAMP). Read data from the bit line BL is amplified by the sense amplifier SAMP, and transferred to read/write amplifiers 120 over local data lines (LIO), transfer gate (TG), and global data lines (GIO). Conversely, write data outputted from the read/write amplifiers 120 is transferred to the sense amplifier SAMP over the complementary main data lines GIO, the transfer gate TG, and the complementary local data lines LIO, and written in the memory cell MC coupled to the bit line BL.

The semiconductor device 100 may employ a plurality of external terminals, such as solder pads, that include command and address (C/A) terminals coupled to a command and address bus to receive commands and addresses, clock terminals to receive clocks CK and /CK, data terminals DQ coupled to a data bus to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data. The input/output circuit 122 may include a number of interface connections, each of which may be couplable to one of the DQ pads (e.g., the solder pads which may act as external connections to the device 100).

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The column decoder 110 may provide a column select signal CS, which may activate a selected one of the sense amplifiers SAMP. The address decoder 104 may also supply a decoded bank address BADD, which may indicate the bank of the memory array 118 containing the decoded row address XADD and column address YADD. The row address XADD may indicate the sub-bank within the bank indicated by BADD.

The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is provided along the data bus and output to outside from the data terminals DQ via the input/output circuit 122.

The device 100 may receive an access command which is a write command. When the write command is received, and a bank address, a row address and a column address are timely supplied with the write command, write data supplied to the data terminals DQ is provided along the data bus and written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The memory device 100 includes a BTI oscillator 130 which provides a periodic BTI signal BTI_toggle. The BTI signal may be used when the device is in a standby mode to alleviate or mitigate BTI degradation of one or more transistors along a clock path (e.g., from clock input circuit 112 through the internal clock generator 114 to the IO circuits 122) and/or a data path (e.g., within the IO circuit 122).

The device 100 includes refresh control circuits 116 each associated with a bank of the memory array 118. Each refresh control circuit 116 may determine when to perform a refresh operation on the associated bank. The refresh control circuit 116 provides a refresh address RXADD (along with one or more refresh signals, not shown in FIG.

1). The row decoder 108 performs a refresh operation on one or more word lines associated with RXADD. The refresh control circuit 116 may perform multiple types of refresh operation, which may determine how the address RXADD is generated, as well as other details such as how many word lines are associated with the address RXADD. During a self-refresh mode, the memory device 100 may generate a refresh signal based on internal logic and perform refresh operations based on internal timing.

During the standby mode, the memory device 100 may still receive external clock signals CK and/CK. However, the local clocks LCLK may not be generated and distributed by the internal clock generator 114 when a command is not received. For example, a clock gating circuit of the internal clock generator 114 may be used to pass the clock ICLK as the clock LCLK when a command (e.g., R/W) is received. To avoid conflicts with the clock signals, a BTI logic circuit 131 may generate a BTI pulse signal BTI_toggle_pulse based on the periodic BTI signal BTI_toggle. The BTI pulse signal BTI_toggle_pulse signal may be synchronized to the clock signal CK and/CK and/or to one or more clock signals derived therefrom, such as ICLK. The signal BTI_toggle_pulse is coupled to the clock gating circuit (e.g., within the internal clock generator 114) and the clock LCLK may be provided either when a command is received or when the BTI pulse signal BTI_toggle_pulse is active. In some embodiments, to save power, a counter circuit may be used to control how often BTI_toggle_pulse is provided. In some embodiments, a pulse extender may be used to control how many pulses of the clock signal ICLK are passed for each time that BTI_toggle_pulse is active.

During certain operational modes of the device 100, an external clock signal (CK and/CK) is not received by the device 100. For example, during a self-refresh mode or a power saving mode of the device, the clock signal may not be received. During such unclocked modes where the external clock is not received, it may still be desirable to perform BTI mitigation. In such situations, during an unclocked mode, the BTI toggle signal may be provided to the clock input circuit 112 and passed to the clock circuits (e.g., the internal clock generator 114 and the IO circuits 122). During an unclocked mode, the signals BTI toggle may also be provided to circuits in a data path (e.g., in the IO circuit).

In this matter, when BTI mitigation operations are enabled (e.g., by a BTI enable signal not shown in FIG. 1), if the device 100 is in a clocked idle state (e.g., a standby mode), a BTI_toggle_pulse signal is generated from the BTI toggle signal from the BTI oscillator 130 and used to control a gating of when the clock signal ICLK is provided to the IO circuit 122 (e.g., to a clock tree of the IO circuit 122). When the device 100 is in an unclocked mode (e.g., self-refresh or power save modes), the signal BTI_toggle is provided from the oscillator 130 to a clock input circuit 112 and also to a data path (e.g., in the IO circuits 122) of the device.

The power supply terminals are supplied with power supply potentials VDD and VSS. The power supply potentials VDD and VSS are supplied to an internal voltage generator circuit 124. The internal voltage generator circuit 124 generates various internal potentials VARY, and the like based on the power supply potentials VDD and VSS supplied to the power supply terminals.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

The device 100 includes refresh control circuits 116 each associated with a bank of the memory array 118. Each refresh control circuit 116 may determine when to perform a refresh operation on the associated bank. The refresh control circuit 116 provides a refresh address RXADD (along with one or more refresh signals, not shown in FIG. 1). The row decoder 108 performs a refresh operation on one or more word lines associated with RXADD. The refresh control circuit 116 may perform multiple types of refresh operation, which may determine how the address RXADD is generated, as well as other details such as how many word lines are associated with the address RXADD.

Figure 2:
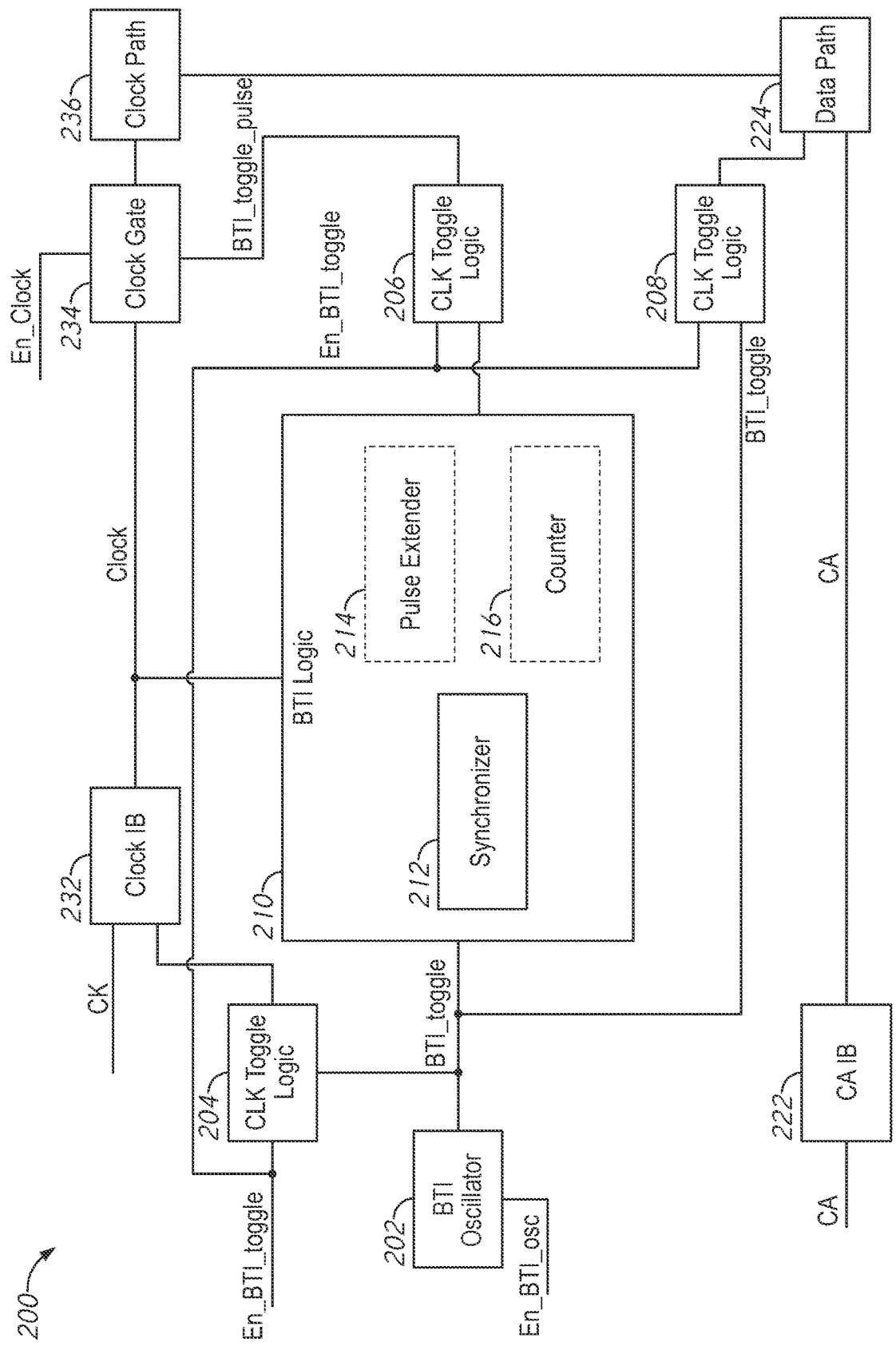
FIG. 2 is a block diagram of clock and BTI logic according to some embodiments of the present disclosure.

FIG. 2 is a block diagram of clock and BTI logic according to some embodiments of the present disclosure. The clock and BTI logic 200 may, in some embodiments, represent a portion of a memory device, such as the device 100 of FIG. 1. For the sake of clarity, certain components and signals have been omitted from the view of FIG. 2.

A clock input buffer 232 (e.g., 112 of FIG. 1) receives an external clock signal CK and provides a signal Clock. A clock gating circuit 234 (e.g., which may be a component of internal clock generator 114 of FIG. 1) passes the clock signal Clock to a clock path 236 (e.g., a part of IO circuit 122 of FIG. 1) when an enable signal En_Clock is active or when a BTI toggle pulse signal BTI_toggle_pulse is active. A command and address input buffer 222 (e.g., 102 of FIG. 1) receives command and addresses CA and passes them to a data path 224 (e.g., a component of IO circuit 122). The data path 224 may operate with timing based on signals from the clock path 236.

A BTI oscillator 202 (e.g., 130 of FIG. 1) provides a periodic BTI signal BTI_toggle when a BTI enable signal En_BTI_osc is active. The periodic BTI_toggle signal is provided to a BTI logic circuit 210 (e.g., 131 of FIG. 1) which provides a signal BTI_toggle_pulse which is synchronized to a clock signal Clock.

The clock and BTI logic 200 also includes clock toggle logic circuits 204-208 which change an operation of the clock and BTI logic 200 based on a device mode. A mode signal En_BTI_toggle may indicate if the device is in a clocked or unclocked mode (e.g., a self-refresh or low power mode). When the mode signal En_BTI_toggle is active, the clock toggle logic circuit 204 may provide the periodic signal BTI_toggle to the clock input buffer 232 and the clock toggle logic 208 may provide the signal BTI_toggle to the data path 224. Similarly, when the signal En_BTI_toggle is active, the clock toggle logic 206 may bypass the BTI logic 210 and pass the signal BTI_toggle_pulse at an active level, so that the clock gating circuit 234 passes the signal Clock (which is the signal BTI_toggle in this mode).

The BTI oscillator 202 generates a periodic signal BTI_toggle when an enable signal En_BTI_osc is activated. The signal EN_BTI_osc may be provided at an active level when the settings of the memory call for BTI mitigation to be performed. For example, the signal En_BTI_osc may active when the device is in a standby or idle mode.

The BTI_toggle signal is provided to BTI logic 210. The BTI logic 210 generates a signal BTI_toggle_pulse based off of the signal BTI_toggle. The BTI logic 210 includes a synchronizer circuit 212 which is synchronized to the clock signal Clock from the clock input buffer 232. The synchronizer 212 ensures that the signal BTI_toggle_pulse is synchronous with the signal Clock, since the signal BTI_toggle may be asynchronous.

Figure 4:
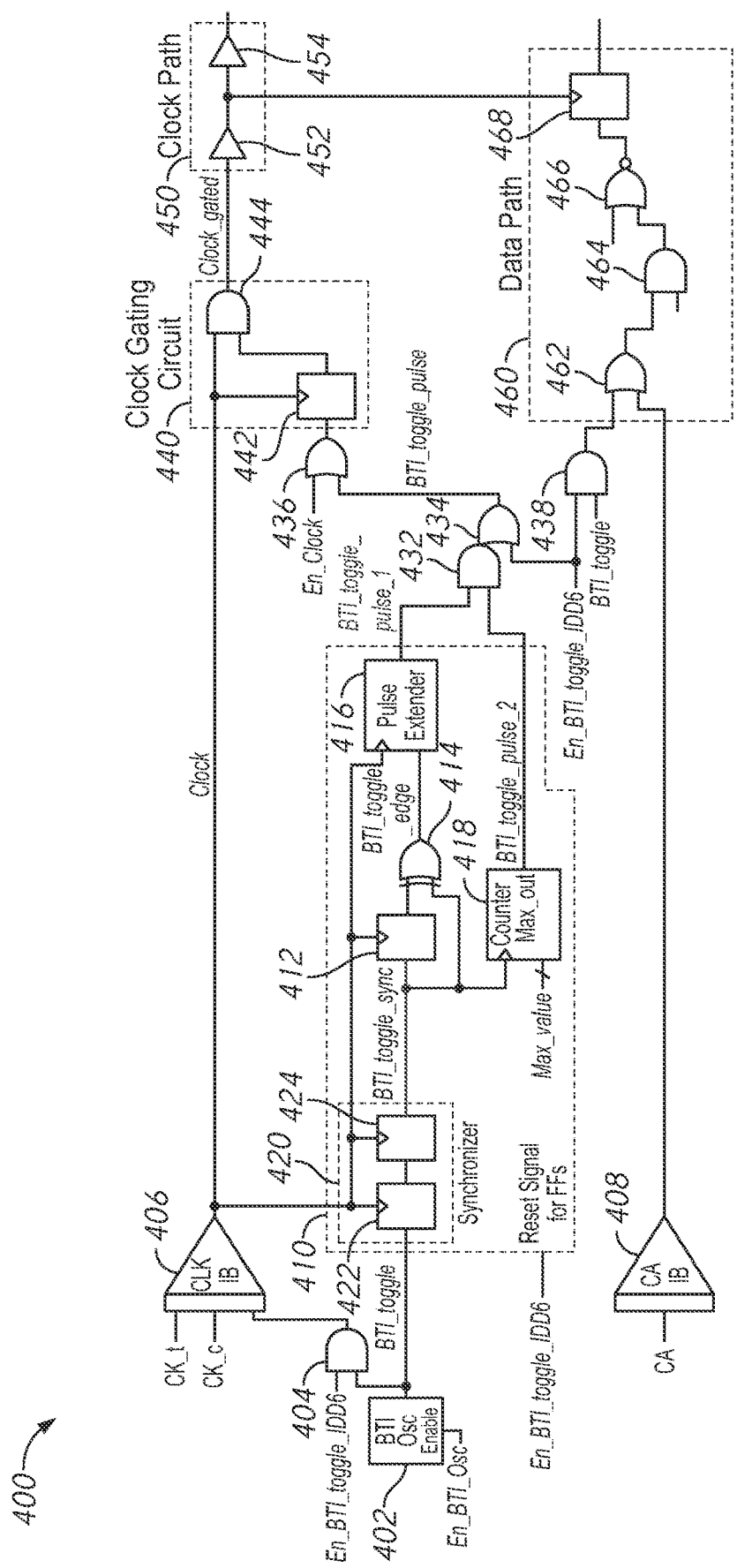
FIG. 4 is a schematic diagram of clock and BTI logic according to some embodiments of the present disclosure.
Figure 5:
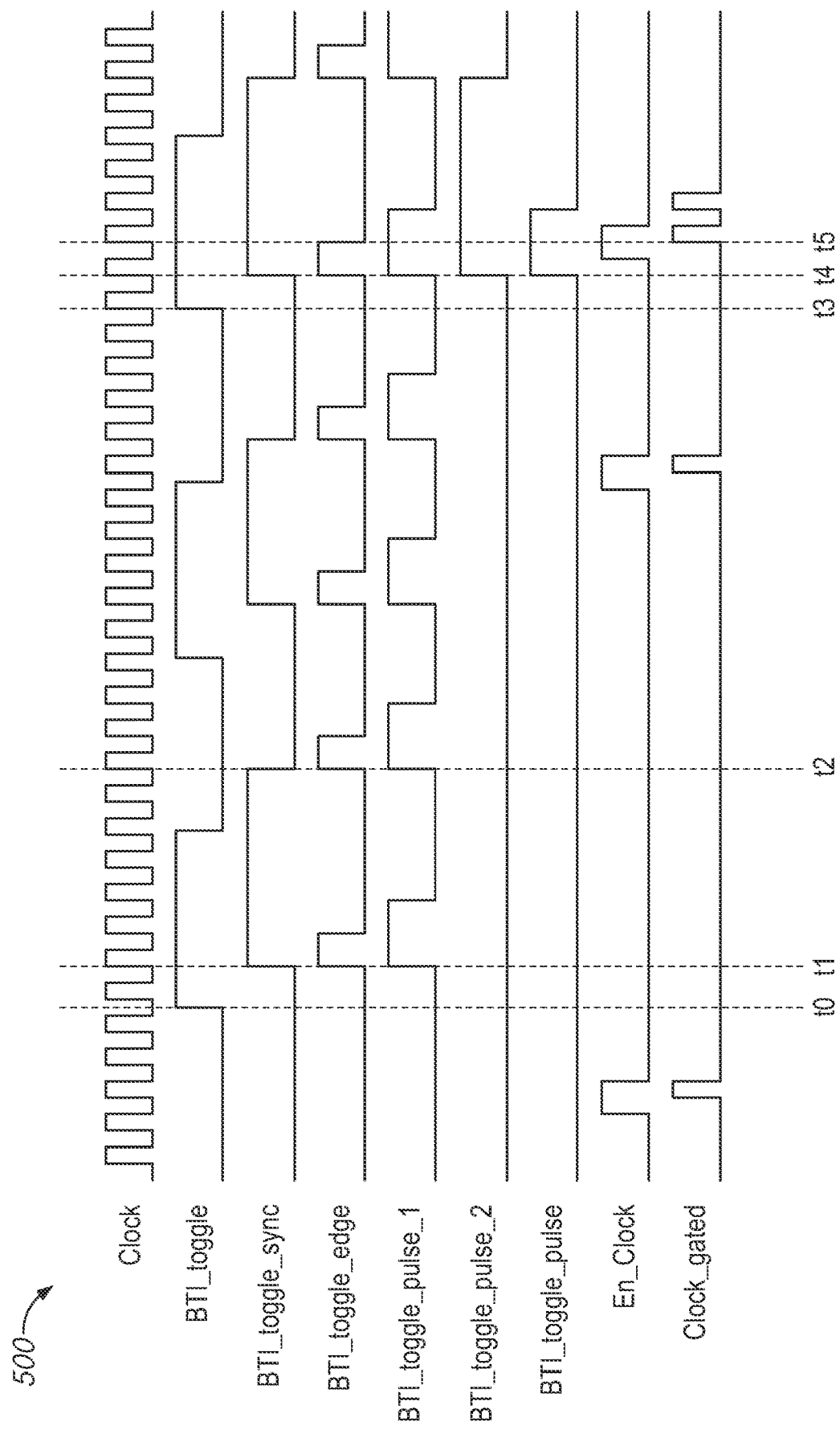
FIG. 5 is a timing diagram of memory operations during a clocked mode according to some embodiments of the present disclosure.
Figure 6:
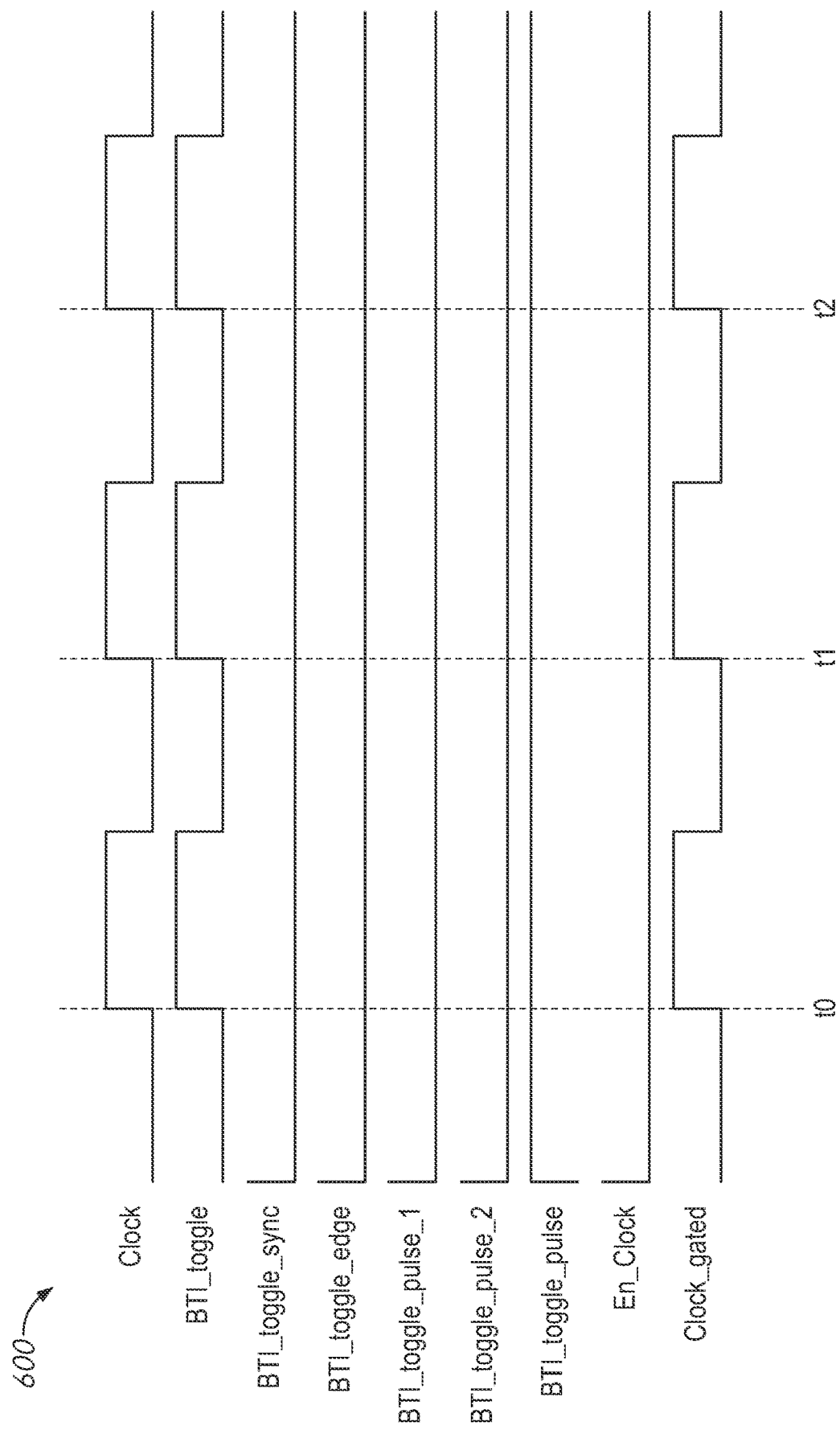
FIG. 6 is a timing diagram of memory operations during an unclocked mode according to some embodiments of the present disclosure.
Figure 7:
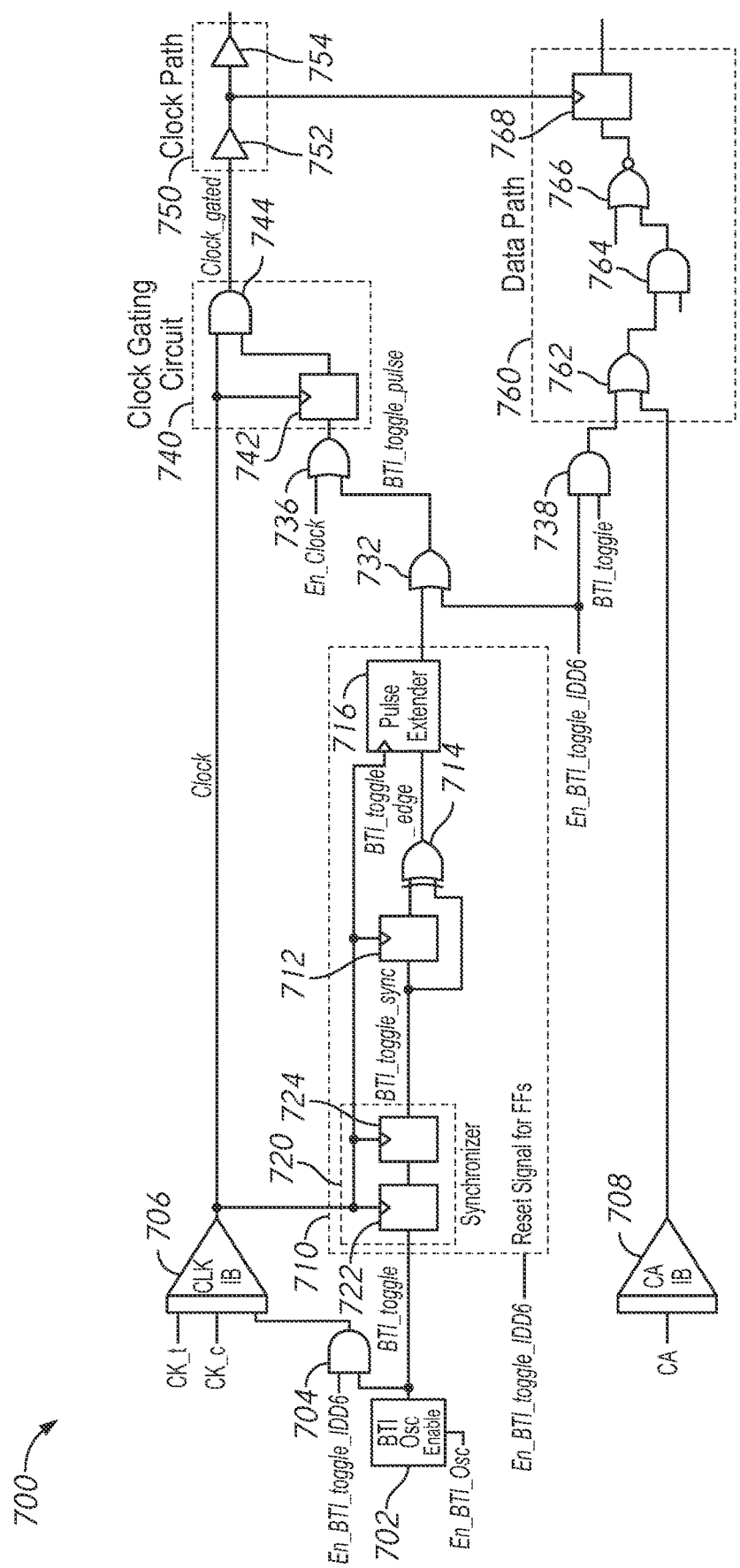
FIG. 7 is a schematic diagram of clock and BTI logic according to some embodiments of the present disclosure.
Figure 8:
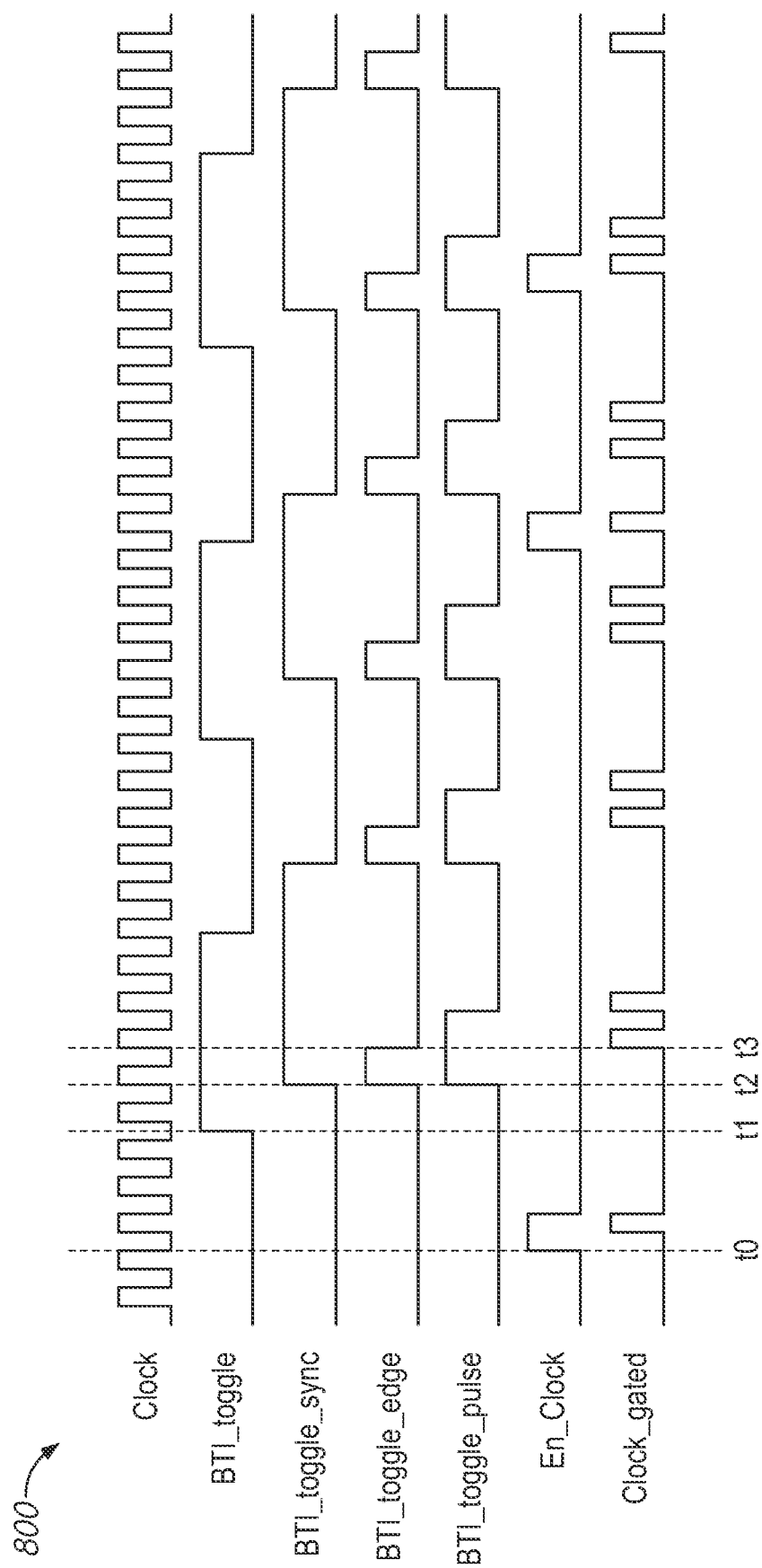
FIG. 8 is a timing diagram of memory operations during a clocked mode according to some embodiments of the present disclosure.
Figure 9:
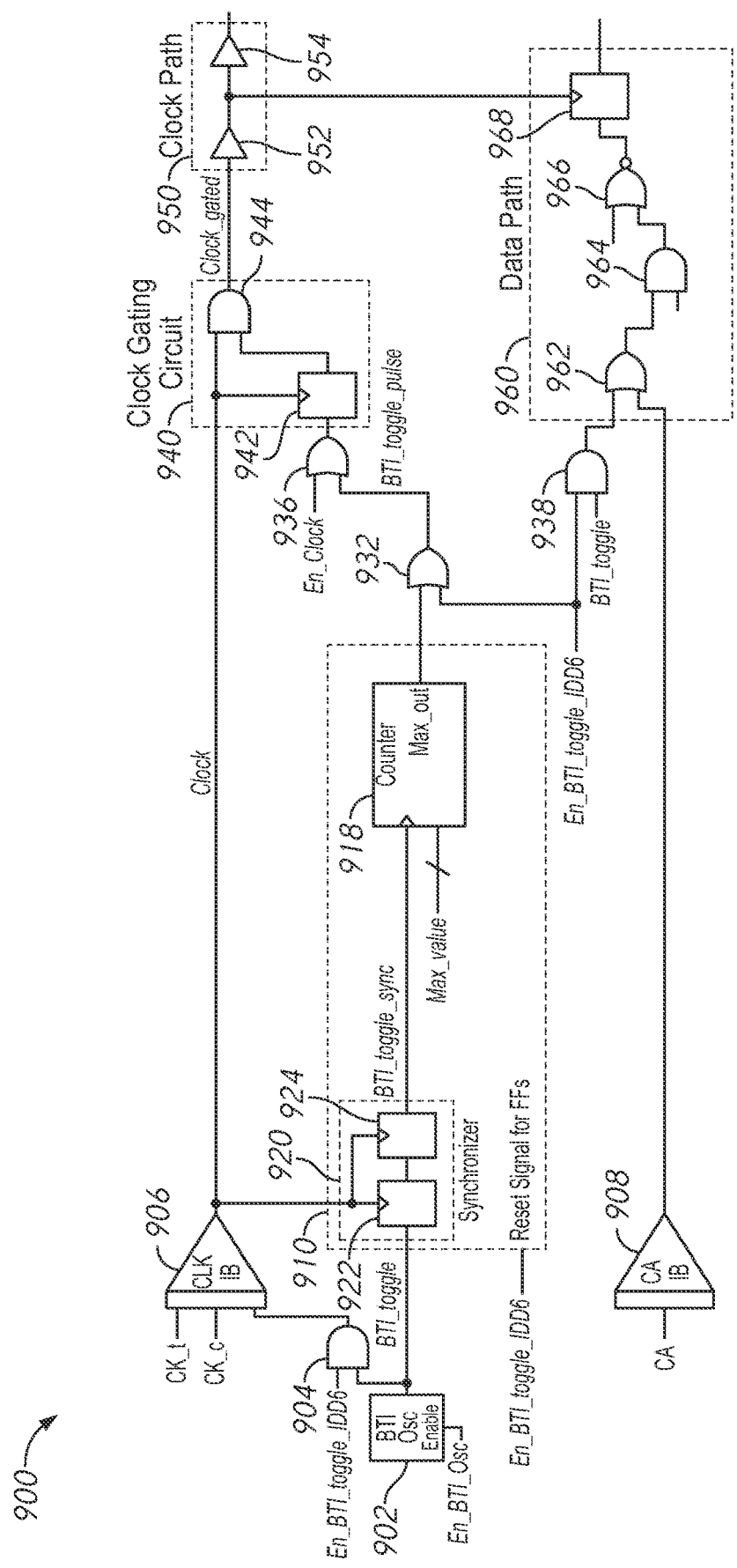
FIG. 9 is a schematic diagram of clock and BTI logic according to some embodiments of the present disclosure.
Figure 10:
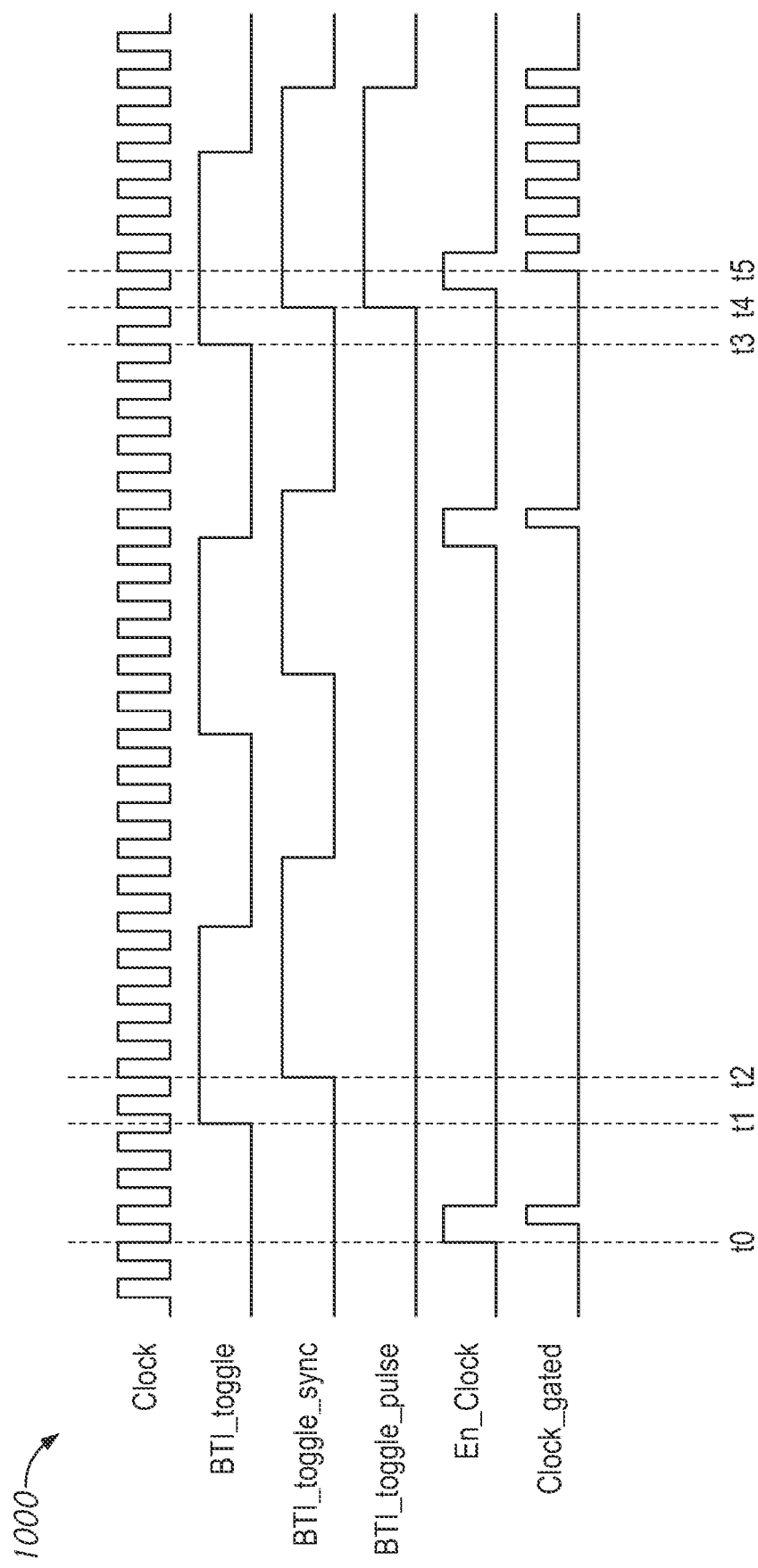
FIG. 10 is a timing diagram of memory operations during a clocked mode according to some embodiments of the present disclosure.

In some embodiments, an optional pulse extender 214 may be used to control a length of the signal BTI_toggle_pulse. For example, the pulse extender circuit 214 may receive a pulsed intermediate signal from the synchronizer 212 and provide a signal BTI_toggle_pulse which has a longer pulse than the intermediate signal. The length of extension from the pulse extender 214 may determine how many cycles of the clock signal Clock are passed by the clock gating circuit 234 each time the signal BTI_toggle_pulse is active (e.g., by controlling how long BTI_toggle_pulse is active for). In some embodiments, an optional counter circuit 216 may be used to control when the signal BTI_toggle_pulse is provided. For example, the BTI_toggle_pulse may be provided after N pulses of an intermediate BTI signal provided by the synchronizer 212. The value of N may be a setting of the memory, such as a fuse setting, and may be used to manage how much power the BTI mitigation operations draw (e.g., by reducing how frequently they occur). FIGS. 4-6 describe an example embodiment with both a pulse extender and counter circuit in more detail. FIGS. 7-8 describe an example embodiment with a pulse extender, but not a counter, in more detail. FIGS. 9-10 describe an example embodiment with a counter, but not a pulse extender in more detail.

When the signal En_BTI_toggle is inactive (e.g., at a low logical level), the clock toggle logic 206 passes the signal BTI_toggle_pulse to the clock gating circuit 234. The clock gating circuit 234 passes the clock signal Clock to the clock path 236 when either the signal En_Clock or the signal BTI_toggle_pulse is at an active level. The signal BTI_toggle_pulse is synchronized to the clock signal Clock and based on the BTI oscillator signal BTI_toggle. The signal En_Clock is active based on a command being received.

The clock path 236 distributes the clock signal Clock to latches of the data path 224. The latches of the data path 224 store data (e.g., either for read or write operations) synchronized to the clock signal Clock. During BTI operations (e.g., when En_Clock is low), no data may be provided, but the BTI signal may help to mitigate BTI decay of the transistors in the circuits along the clock path 236 (and along the data path in an unclocked mode).

The clock toggle circuit 204 provides the BTI periodic signal BTI_toggle to the clock input buffer 232 when the signal En_BTI_toggle is active (e.g., because the device is in an unclocked mode). The clock toggle circuit 206 provides the signal BTI_toggle_pulse at an active level when the signal En_BTI_toggle is active (e.g., to open the clock gating circuit 234). The clock toggle circuit 208 provides the periodic BTI signal BTI_toggle to the data path 224 when the signal BTI_toggle_pulse is active.

Figure 3:
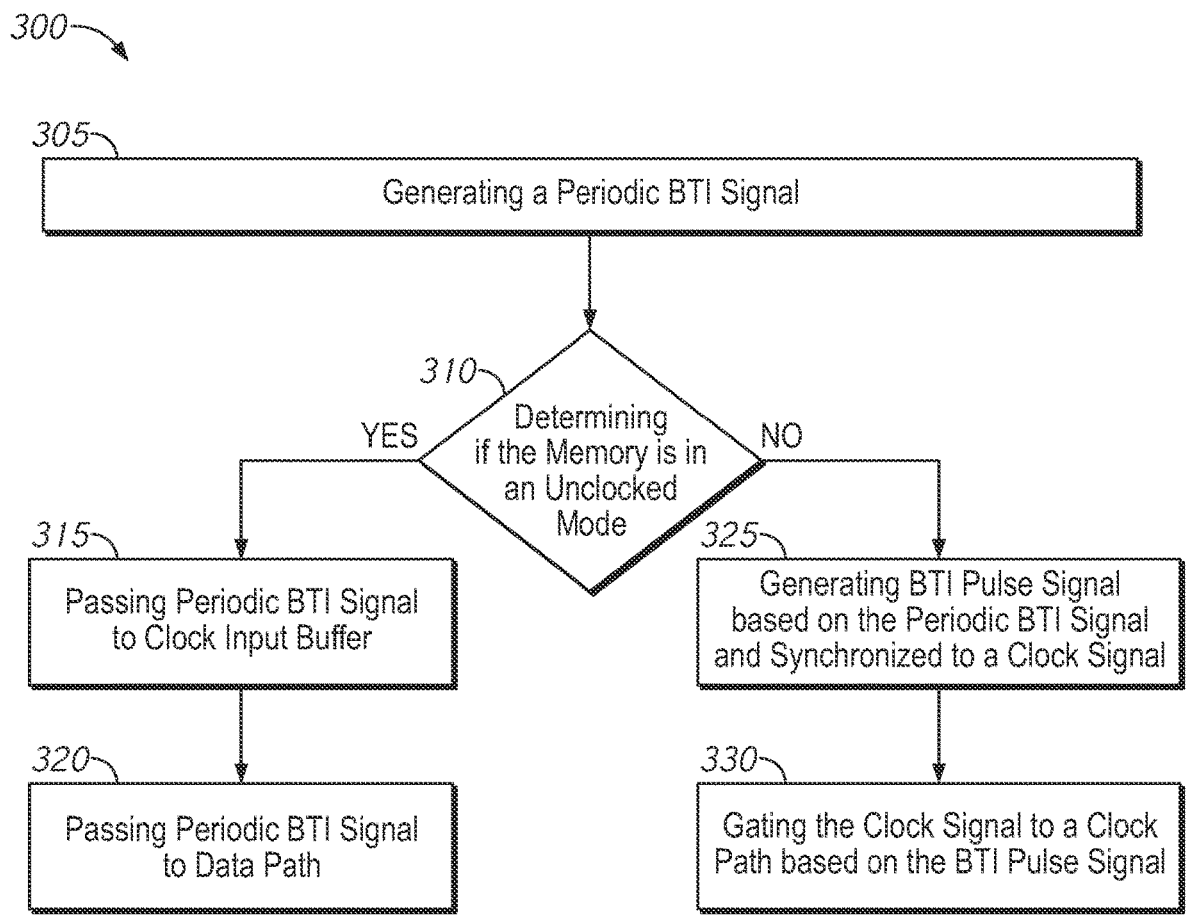
FIG. 3 is a flow chart of a method according to some embodiments of the present disclosure.

FIG. 3 is a flow chart of a method according to some embodiments of the present disclosure. The method 300 may, in some embodiments, be implemented by one or more of the circuits described in FIGS. 1-2.

The method 300 begins with block 305, which describes generating a periodic BTI signal. For example, a BTI oscillator (e.g., 130 of FIGS. 1 and/or 202 of FIG. 2) provides the periodic BTI signal (e.g., BTI_toggle). The method 300 may include providing the periodic BTI signal when a BTI enable signal is active.

The method 300 may include block 310, which describes determining if the memory is in an unclocked mode or not. For example, block 310 may include determining if the device is receiving an external clock signal or not. In some embodiments, the memory may transition between clocked and unclocked operational modes. The method 300 may include providing a clock toggle signal (e.g., En_BTI_toggle of FIG. 2) at an active level when the memory is in a unclocked mode.

If the memory is in an unclocked mode, method 300 may proceed to blocks 315 and 320. Block 315 describes passing the periodic BTI signal to a clock input buffer circuit (e.g., 112 of FIGS. 1 and/or 232 of FIG. 2). The periodic BTI signal may be passed as a clock signal to a clock path of the memory. For example, the method 300 may include providing a BTI pulse signal at an active level to a clock gating circuit to pass the signal clock while the memory is in the unclocked mode. Block 320 describes passing periodic BTI signal to data path.

If the memory is not in an unclocked mode, the method 300 proceeds to block 325, which describes generating a BTI pulse signal based on the periodic BTI signal and synchronized to a clock signal. For example, method 300 may include synchronizing the periodic BTI signal to the clock signal to generate a synchronized BTI signal. In some embodiments, the synchronized BTI signal may be provided as the BTI pulse signal. In some embodiments, the method 300 may include detecting an edge of the synchronized BTI signal to generate an edge BTI signal and extending a pulse of the edge BTI signal to generate the BTI pulse signal. In some embodiments, the method 300 may include counting a number of pulses of the synchronized BTI signal and providing a pulse of the BTI pulse signal based on the count. In some embodiments, both extending the pulse and counting may be used.

Block 325 may be followed by block 330, which describes gating the clock signal to a clock path based on the BTI pulse signal. For example, the method 300 may include passing the clock signal to the clock path when the BTI pulse signal is at an active level. The method 300 may also include gating the clock signal to the clock path when a command is received.

FIG. 4 is a schematic diagram of clock and BTI logic according to some embodiments of the present disclosure. The clock and BTI logic 400 may, in some embodiments, represent an example implementation of the clock and BTI logic 200 of FIG. 2 which includes both a counter circuit and a pulse extender. For the sake of brevity, certain components, features, and operations previously described with respect to FIG. 2 will not be repeated again with respect to FIG. 4.

The clock and BTI logic 400 includes a clock input buffer 406 (e.g., 232 of FIG. 2) which receives external clock signals CK_t and CK_c (e.g., CK and /CK of FIGS. 1-2) and provides the signal Clock to a clock gating circuit 440. A command/address input buffer 408 (e.g., 222 of FIG. 2) provides command and addresses to a data path 460.

A BTI oscillator circuit 402 (e.g., 202 of FIG. 2) provides a periodic BTI signal BTI_toggle when a BTI enable signal En_BTI_Osc is active. The periodic BTI signal BTI_toggle is used by BTI logic 410 (e.g., 210 of FIG. 1) to generate a synchronized BTI pulse signal BTI_toggle_pulse which is provided to the clock gating circuit 440. The clock gating circuit 440 provides the signal Clock to a clock path 450 when a clock enable signal En_Clock is active or when the signal BTI_toggle pulse is active. As described in more detail herein, additional logic is used to provide periodic signal BTI_toggle to the clock input buffer 406 and data path 460 and open the clock gating circuit 440 when the signal En_BTI_toggle_IDD6 is active, indicating an unclocked mode. The designation IDD6 may represent a particular unclocked mode of the memory, however the mode signal En_BTI_toggle_IDD6 may be active for any unclocked mode, not just an IDD6 mode. For example, the signal En_BTI_toggle_IDD6 may also be active during an IDD8 mode.

The BTI logic 410 includes a synchronizer 420. The synchronizer includes two latches 422 and 424 coupled in series, with an input of the second latch 424 coupled to an output of the first latch 422. The first latch has an input coupled to BTI_toggle. The second latch provides a synchronized BTI signal BTI_toggle_sync. Both of the latches 422 and 424 have clock terminals coupled in common to the signal Clock provided by the clock input buffer 406. Accordingly, the signal BTI_toggle_sync will be in synchronization with the signal Clock. The latches 422 and 424 have reset terminals coupled to the signal En_BTI_toggle_IDD6. Accordingly, when the memory is in an unclocked mode, the synchronizer 420 is suppressed and the signal BTI_toggle_sync is not provided.

The signal BTI_toggle_sync is provided to clock terminal of a counter circuit 418. Each time the synchronized BTI signal BTI_toggle_sync activates (e.g., each rising edge of BTI_toggle_sync) the counter circuit 418 changes a count value. For example, the counter circuit 418 may increment the count value. When the count value crosses a threshold Max_value, for example by meeting or exceeding the threshold value, the counter circuit 418 provides a second intermediate signal BTI_toggle_pulse_2 at an active level. The counter circuit 418 may also reset the count value when the signal BTI_toggle_pulse_2 is provided. The threshold Max_value may be a setting of the memory. For example the threshold may be a fuse setting of the memory.

The signal BTI_toggle_sync is also provided to an input terminal of a latch 412, which has a clock terminal coupled to Clock. An output of the latch 412 is coupled to a first input of an XOR gate 414 while the other input of the XOR gate 414 is coupled to the signal BTI_toggle_sync. The XOR gate 414 provides the BTI edge signal BTI_toggle_edge. The latch 412 and XOR gate 414 may work together as an edge detector. The BTI edge detection signal BTI_toggle_edge may be active every time the signal BTI_toggle_sync changes levels.

The signal BTI_toggle_edge is provided to a pulse extender 416. The pulse extender has a clock terminal coupled to Clock. Each time the signal BTI_toggle_edge activates, the pulse extender 416 provides a first intermediate signal BTI_toggle_pulse_1 which is active for a number of cycles of the clock signal Clock. An AND gate 432 provides the BTI pulse signal BTI_toggle_pulse (through OR gate 434) when both BTI_toggle_pulse_1 and BTI_toggle_pulse_2 are active. The OR gate 434 (e.g., clock toggle logic 206) has inputs coupled to the output of the AND gate 432 and to the signal En_BTI_toggle_IDD6. The OR gate 434 provides the signal BTI_toggle_pulse when either the output of the AND gate 432 is active or when the signal En_BTI_toggle_IDD6 is active. Accordingly, the signal BTI_toggle_pulse is active for a length of time based on the pulse extender 416, in synchronization with the clock signal Clock, when the counter circuit 418 counts Max_value activations of BTI_toggle_sync or when En_BTI_toggle_IDD6 is active.

The clock gating circuit 440 receives the clock signal Clock and provides a signal Clock_gated when an input signal provided by OR gate 436 is active. The OR gate 436 has an input coupled to BTI_toggle_pulse and an input coupled to En_Clock. The signal En_Clock is active when a command is received. The clock gating circuit 440 includes a latch 442 with an input coupled to the output of the OR gate 436 and a clock terminal coupled to Clock. The clock gating circuit 440 also includes an AND gate 444 with an input coupled to Clock and an input coupled to the latch 442. When the latch stores an active value (e.g., because either En_Clock or BTI_toggle_pulse is active), in synchronization with the clock signal the AND gate 444 provides the signal Clock to the clock path 450.

The clock path 450 includes various buffers which distribute the clock signal Clock. For the sake of brevity only two buffers, 452 and 454 are shown as an example. However, more buffers and branches of the clock path may exist in other example embodiments. The clock path 450 distributes the clock signal to data latches (e.g., 468) of the data path 460 so that the clock signal may be used to manage the timing of access operations. The data path 460, similar to the clock path 450, shows certain example logic. However, the gates and latches shown in FIG. 4 may represent only a small portion of the data path 460. The data path 460 shows logic gates 462-466 which receive signals from the CA input buffer 408 (along with other signals, not shown) and load them into a latch 468 with timing based on the signal Clock_gated provided by the clock path 450.

The BTI and clock logic 400 may toggle between a clocked mode and an unclocked mode. The signal En_BTI_toggle_IDD6 may be active to indicate an unclocked mode, such as an IDD6 or IDD8 mode of the memory. Logic gates 402, 434, and 438 may toggle the logic 400 between clocked and unclocked modes when the signal En_BTI_toggle_IDD6 is active. An AND gate 404 (e.g., 204 of FIG. 2) receives the periodic BTI signal BTI_toggle and En_BTI_toggle_IDD6 and provides the signal BTI_toggle as an input to the clock buffer 406 when the signal En_BTI_toggle_IDD6 is active. Accordingly, when En_BTI_toggle_IDD6 is active, the signal BTI_toggle may be passed as the clock signal Clock.

An OR gate 434 (e.g., 206 of FIG. 2) provides the signal BTI_toggle_pulse at an active level whenever both BTI_toggle_pulse_1 and BTI_toggle_pulse_2 are both active or when En_BTI_toggle_IDD6 is active. In this manner, the clock gating circuit 440 may be 'open', freely passing the clock signal Clock (which in this case is BTI_toggle) when En_BTI_toggle_IDD6 is active. The AND gate 438 (e.g., 208 of FIG. 2) passes the signal BTI_toggle to the data path 460 when En_BTI_toggle_IDD6 is active.

FIG. 5 is a timing diagram of memory operations during a clocked mode according to some embodiments of the present disclosure. The timing diagram 500 may, in some embodiments, represent the operation of BTI and clock logic, such as the BTI and clock logic 400 of FIG. 4 during a mode when an external clock signal (e.g., CK_t and CK_c) is received, and the signal En_BTI_toggle_IDD6 is inactive.

The timing diagram 500 shows traces for various signals, such as the clock signal Clock, periodic BTI_toggle, BTI pulse signal BTI_toggle_pulse and others. The signals are shown as idealized waveforms which transition between logical high and logical low levels. Since in a memory logical levels may be represented by voltages, which may experience delays, distortion, noise, etc., the diagram 500 may be simplified compared to actual operations.

At an initial time t0, the periodic BTI signal BTI_toggle activates out of sync with the clock signal Clock. At a first time t1, (on the second activation of Clock after BTI_toggle became active), the synchronizer (e.g., 420 of FIG. 4) provides the synchronized BTI signal BTI_toggle_sync at an active level. Since the signal BTI_toggle_sync is changing levels, the edge detector (e.g., latch 412 and XOR gate 414 of FIG. 4) provides a pulse of BTI edge signal BTI_toggle_edge. The pulse of the edge signal BTI_toggle_pulse_1 causes the pulse extender (e.g., 416 of FIG. 4) provides the first intermediate signal BTI_toggle_pulse_1 at an active level for two periods of the clock signal Clock. However, since the count value in the counter (e.g., 418 of FIG. 4) hasn't reached the threshold, the second intermediate signal BTI_toggle_pulse_2 does not activated responsive to BTI_toggle_sync at the time t1. Accordingly, the signal BTI_toggle_pulse remains inactive. At the time t2, the falling edge of BTI_toggle_sync causes another pulse of BTI_toggle_edge and BTI_toggle_pulse_1.

At a third time t3, the signal BTI_toggle activates again, followed by a synchronized activation of BTI_toggle_sync at t4. Similar to the time t1, both BTI_toggle_edge and BTI_toggle_pulse_1 activate. At the time t3, the count value reaches Max_value, and BTI_toggle_pulse_2 also becomes active. This, in turn, causes BTI_toggle_pulse to become active (for an amount of time based on BTI_toggle_pulse_1). Since BTI_toggle_pulse is active, the signal Clock is passed as the signal Clock_gated. Since BTI_toggle_pulse_1 is active for two periods of Clock, two pulses of Clock are passed as Clock_gated at the time t5. Note that between t4 and t5, the signal En_Clock becomes active (indicating an access operation) and that this does not interfere with the timing of passing Clock_gated even though BTI_toggle_pulse is active at the same time.

FIG. 6 is a timing diagram of memory operations during an unclocked mode according to some embodiments of the present disclosure. The timing diagram 600 of FIG. 6 shows an operational mode where the memory is unclocked. The timing diagram 600 may represent the operation of BTI and clock logic, such as the BTI and clock logic 400 of FIG. 4 during a mode when an external clock signal (e.g., CK_t and CK_c) is not received, and the signal En_BTI_toggle_IDD6 is active. The memory may toggle between the operations represented by the timing diagram 600 and the timing diagram 500 of FIG. 5 based on the state of En_BTI_toggle_IDD6.

Since the timing diagram 600 may generally be similar to the timing diagram 500 of FIG. 5, features already described with respect to FIG. 5 will not be repeated again with respect to FIG. 6.

In the timing diagram 600 of FIG. 6, the BTI oscillator signal BTI_toggle is provided as the clock signal Clock. Since the signal En_BTI_toggle_IDD6 is active, the BTI logic is disabled (e.g., because the synchronizer is reset), and so the signals BTI_toggle_sync, BTI_toggle_edge, BTI_toggle_pulse_1, BTI_toggle_pulse_2, and BTI_toggle_pulse all remain inactive. Instead, since the clock gating circuit is opened by the signal En_BTI_toggle_IDD6, the signal Clock (which is BTI_toggle) is passed as Clock_gated. As may be seen at example times t0-t2, the signals Clock, BTI_toggle_ and Clock_gated are the same.

FIG. 7 is a schematic diagram of clock and BTI logic according to some embodiments of the present disclosure. The clock and BTI logic 700 may, in some embodiments, represent an example implementation of the clock and BTI logic 200 of FIG. 2 which includes a pulse extender. However, unlike the clock and BTI logic 400 of FIG. 4, the clock and BTI logic 700 does not include a counter circuit. Except for the BTI logic 710, the other components of the BTI and clock logic 700 may generally be the same as the analogous components of the BTI and clock logic circuit 400 of FIG. 4. For the sake of brevity, certain components, features, and operations previously described with respect to FIG. 2 and/or FIG. 4 will not be repeated again with respect to FIG. 7.

The clock and BTI logic 700 includes a clock input buffer 706 (e.g., 232 of FIGS. 2 and/or 406 of FIG. 4) which receives external clock signals CK_t and CK_c (e.g., CK and /CK of FIGS. 1-2) and provides the signal Clock to a clock gating circuit 740 which includes latch 742 and logic gate 744. A command/address input buffer 708 (e.g., 222 of FIG. 2) provides command and addresses to a data path 760 which includes logic gates 762-766 and latch 768.

A BTI oscillator circuit 702 (e.g., 202 of FIGS. 2 and/or 402 of FIG. 4) provides a periodic BTI signal BTI_toggle when a BTI enable signal En_BTI_Osc is active. The periodic BTI signal BTI_toggle is used by BTI logic 710 (e.g., 210 of FIG. 1) to generate a synchronized BTI pulse signal BTI_toggle_pulse which is provided to the clock gating circuit 740. The clock gating circuit 740 provides the signal Clock to a clock path 750 when a clock enable signal En_Clock is active or when the signal BTI_toggle_pulse is active. As described in more detail herein, additional logic is used to provide periodic signal BTI_toggle to the clock input buffer 706 and data path 760 and open the clock gating circuit 740 when the signal En_BTI_toggle_IDD6 is active, indicating an unclocked mode.

The BTI logic 710 of FIG. 7 includes a synchronizer 720 with two latches, 722 and 724, which generate a signal BTI_toggle_sync, which is the periodic signal BTI_toggle in synchronization with the clock signal Clock. The synchronized signal BTI_toggle_sync is provided to an edge detector which includes latch 712 and XOR gate 714. The XOR gate 714 provides a signal BTI_toggle_edge at an active level for a period of Clock each time the level of BTI_toggle_sync changes. The signal BTI_toggle_edge is provided to a pulse extender 716, which provides the signal BTI_toggle_pulse (through OR gate 732).

Accordingly, the BTI logic 710 receives a periodic signal BTI_toggle and synchronizes it the clock signal Clock to generate BTI_toggle_sync. For each change in the state of BTI_toggle_sync (e.g., each rising and falling edge) a signal BTI_toggle_pulse is generated with a length based on the pulse extender 716.

Logic gates 704, 732, and 738 may act as clock toggle logic to switch the operation of the clock and BTI logic 700 between a clocked mode and an unclocked mode. When a signal En_BTI_toggle_IDD6, the logic 700 may enter a mode where the operation of the BTI logic 700 is suppressed and the periodic BTI signal BTI_toggle is provided to the clock input buffer 706 and data path 760 and the clock gating circuit is open.

FIG. 8 is a timing diagram of memory operations during a clocked mode according to some embodiments of the present disclosure. The timing diagram 800 may, in some embodiments, represent the operation of BTI and clock logic, such as the BTI and clock logic 700 of FIG. 7 during a mode when an external clock signal (e.g., CK_t and CK_c) is received, and the signal En_BTI_toggle_IDD6 is inactive. Since the timing diagram 800 may be generally similar to the timing diagram 500 of FIG. 5, for the sake of brevity features already described with respect to FIG. 5 will not be repeated again with respect to FIG. 8.

At an initial time t0, an access operation is performed, which causes the clock enable signal En_Clock to be activated. This causes the clock gating circuit (e.g., 740 of FIG. 7) to pass a pulse of the clock signal Clock as Clock_gated.

At a first time t1, the periodic BTI signal BTI_toggle becomes active. In synchronization with the clock signal Clock, the synchronizer (e.g., 720 of FIG. 7) provides the synchronized BTI signal BTI_toggle_sync. Since the level of BTI_toggle_sync has changed (e.g., a rising edge at t2), the edge detector (e.g., latch 712 and XOR gate 714) provides a pulse of BTI edge signal BTI_toggle_edge at t2. A pulse extender (e.g., 716 of FIG. 7) provides a pulse of the BTI pulse signal BTI_toggle_pulse with a length based on the clock signal Clock (in this case, two periods of Clock). Responsive to the BTI pulse signal BTI_toggle_pulse being active, at a time t3, the clock gating circuit (e.g., 740 of FIG. 7) passes the clock signal Clock as Clock_gated. In the example of FIG. 8, two periods of Clock are passed as Clock_gated due to the pulse extender.

FIG. 8 represents the operation of clock and BTI logic, such as 700 of FIG. 7, in a clocked mode. The clock and BTI logic 700 may also operate in an unclocked mode, which would operate in a manner similar to the waveforms described in FIG. 6.

FIG. 9 is a schematic diagram of clock and BTI logic according to some embodiments of the present disclosure. The clock and BTI logic 900 may, in some embodiments, represent an example implementation of the clock and BTI logic 200 of FIG. 2 which includes a counter circuit. However, unlike the clock and BTI logic 400 of FIG. 4, the clock and BTI logic 900 does not include an edge detector and a pulse extender. Except for the BTI logic 910, the other components of the BTI and clock logic 900 may generally be the same as the analogous components of the BTI and clock logic circuit 400 of FIG. 4. For the sake of brevity, certain components, features, and operations previously described with respect to FIG. 2 and/or FIG. 4 will not be repeated again with respect to FIG. 9.

The clock and BTI logic 900 includes a clock input buffer 906 (e.g., 232 of FIGS. 2 and/or 406 of FIG. 4) which receives external clock signals CK_t and CK_c (e.g., CK and /CK of FIGS. 1-2) and provides the signal Clock to a clock gating circuit 940 which includes latch 942 and logic gate 944. A command/address input buffer 908 (e.g., 222 of FIG. 2) provides command and addresses to a data path 960 which includes logic gates 962-966 and latch 968.

A BTI oscillator circuit 902 (e.g., 202 of FIGS. 2 and/or 402 of FIG. 4) provides a periodic BTI signal BTI_toggle when a BTI enable signal En_BTI_Osc is active. The periodic BTI signal BTI_toggle is used by BTI logic 910 (e.g., 210 of FIG. 1) to generate a synchronized BTI pulse signal BTI_toggle_pulse which is provided to the clock gating circuit 940. The clock gating circuit 940 provides the signal Clock to a clock path 950 when a clock enable signal En_Clock is active or when the signal BTI_toggle pulse is active. As described in more detail herein, additional logic is used to provide periodic signal BTI_toggle to the clock input buffer 906 and data path 960 and open the clock gating circuit 940 when the signal En_BTI_toggle_IDD6 is active, indicating an unclocked mode.

The BTI logic 910 of FIG. 9 includes a synchronizer 920 with two latches, 922 and 924, which generate a signal BTI_toggle_sync, which is the periodic signal BTI_toggle in synchronization with the clock signal Clock. The synchronized signal BTI_toggle_sync is provided to a counter circuit 918 (e.g., counter circuit 418 of FIG. 4). The counter circuit 918 counts a number of activations (e.g., rising edges) of BTI_toggle_sync and provides a BTI pulse signal BTI_toggle_pulse (through OR gate 932) when the count reaches a threshold Max_value. The threshold Max_Value may be a setting of the memory. The signal BTI_toggle_sync is coupled to a clock terminal of the counter circuit 918, and each time the signal BTI_toggle_sync activates, a count value of the count circuit 918 is changed (e.g., incremented) and compared to the threshold. When the signal BTI_toggle_pulse is provided, the count value may be reset.

Accordingly, the BTI logic 910 receives a periodic signal BTI_toggle and synchronizes it the clock signal Clock to generate BTI_toggle_sync. When the signal BTI_toggle_sync has activated a threshold number of times, the signal BTI_toggle_sync is provided.

Logic gates 904, 932, and 938 may act as clock toggle logic to switch the operation of the clock and BTI logic 900 between a clocked mode and an unclocked mode. When a signal En_BTI_toggle_IDD6, the logic 900 may enter a mode where the operation of the BTI logic 900 is suppressed and the periodic BTI signal BTI_toggle is provided to the clock input buffer 706 and data path 960 and the clock gating circuit is open.

FIG. 10 is a timing diagram of memory operations during a clocked mode according to some embodiments of the present disclosure. The timing diagram 1000 may, in some embodiments, represent the operation of BTI and clock logic, such as the BTI and clock logic 900 of FIG. 9 during a mode when an external clock signal (e.g., CK_t and CK_c) is received, and the signal En_BTI_toggle_IDD6 is inactive. Since the timing diagram 1000 may be generally similar to the timing diagram 500 of FIG. 5 and 800 of FIG. 8, for the sake of brevity features already described with respect to FIGS. 5 and 8 will not be repeated again with respect to FIG. 10.

At an initial time t0, an access operation is performed, which causes the clock enable signal En_Clock to be activated. This causes the clock gating circuit (e.g., 940 of FIG. 9) to pass a pulse of the clock signal Clock as Clock_gated.

At a first time t1, the periodic BTI signal BTI_toggle becomes active. In synchronization with the clock signal Clock, the synchronizer (e.g., 920 of FIG. 9) provides the synchronized BTI signal BTI_toggle_sync. However, the count value has not yet reached the threshold, so BTI_toggle_pulse is not provided at t2. At a time t3, the periodic BTI signal BTI_toggle becomes active. At a time t4, the synchronizer provides BTI_toggle_sync in synchronization with Clock responsive to BTI_toggle at t3. At the time t4, the count value reaches the threshold after being changed by the counter circuit (e.g., 918 of FIG. 9) responsive to BTI_toggle_sync. Accordingly, at the time t4, the signal BTI_toggle_pulse is provided. Responsive to BTI_toggle_pulse being active, the clock gating circuit (e.g., 950 of FIG. 9) provides the clock signal Clock. The number of clock pulses which is provided is based on a period of the periodic BTI signal BTI_toggle. Note that a command is also received and the signal En_Clock is also active at t5. However, this does not interfere with the clock gating circuit providing the signal Clock_gated.

FIG. 10 represents the operation of clock and BTI logic, such as 900 of FIG. 9, in a clocked mode. The clock and BTI logic 900 may also operate in an unclocked mode, which would operate in a manner similar to the waveforms described in FIG. 6.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
an oscillator circuit configured to provide an internal clock signal asynchronous a clock signal;
a BTI logic circuit, configured to generate a BTI pulse signal synchronized to the clock signal based on the internal clock signal, the BTI pulse signal including a plurality of pulses, wherein the BTI logic circuit further comprises:
a synchronizer circuit configured to provide a synchronized BTI signal based on the periodic BTI signal, wherein the synchronized BTI signal is synchronized to the clock signal and wherein the BTI logic circuit is configured to generate the BTI pulse signal based on the synchronized BTI signal; and
a clock gating circuit configured to allow at least a part or parts of the clock signal overlapping the plurality of pulses to pass through as a gated clock signal.

2. The apparatus of claim 1, wherein the BTI pulse signal including a plurality of pulses, a width of each of the plurality of pulses is different from a half cycle of the internal clock signal.

3. The apparatus of claim 1, wherein the BTI logic circuit, is configured to determine a number of pulses of the BTI pulse signal responsive to a present value.

4. The apparatus of claim 1, wherein the BTI logic circuit further comprises:
an edge detector circuit configured to provide a BTI edge detection signal each time the synchronized BTI signal changes levels; and
a pulse extender circuit configured to provide an intermediate BTI signal based on the BTI edge detection signal, wherein the intermediate BTI signal has a pulse length based on a number of periods of the clock signal, wherein the MI pulse signal is based, at least in part, on the intermediate BTI signal.

5. The apparatus of claim 1, wherein the BTI logic circuit further comprises:
a counter circuit configured to count a number of activations of the synchronized BTI signal and provide an intermediate BTI signal when the count reaches a threshold, wherein the BTI pulse signal is based, at least in part on the intermediate MI signal.

6. An apparatus comprising:
an oscillator circuit configured to provide an internal clock signal asynchronous to a clock signal;
a BTI logic circuit configured to generate a BTI pulse signal synchronized to the clock signal based on the internal clock signal, the BTI pulse signal including a plurality of pulses;
a clock gating circuit configured to allow at least a part or parts of the clock signal overlapping the plurality of pulses to pass through as a gated clock signal;
a clock input buffer configured to provide an input signal as the clock signal;
a first clock toggle logic circuit configured to provide the periodic BTI signal as the input signal to the clock input buffer when a mode signal is active;
a second clock toggle logic circuit configured to provide the BIT pulse signal at the active level when the mode signal is active, wherein the mode signal is active when the apparatus is in an unclocked mode.

7. The apparatus of claim 6, further comprising a third clock toggle logic circuit configured to provide the periodic BTI signal to a data path when the mode signal is active.

8. The apparatus of claim 1, wherein the clock gating circuit is configured to provide the clock signal as a gated clock signal when the BTI pulse signal is active or when a clock enable signal is active.

9. A method comprising:
generating a periodic bias temperature instability (BTI) signal;
determining if a memory is in an unclocked mode;
passing the periodic BTI signal to a clock input buffer if the memory is in the unclocked mode;
generating a BTI pulse signal based on the periodic BTI signal with a BTI logic circuit if the memory is not in an unclocked mode;
gating a clock signal to a clock path based on the BTI pulse signal;
synchronizing the periodic BTI signal to the clock signal to generate a synchronized BTI signal, wherein the BTI pulse signal is based on the synchronized BTI signal; and
counting activations of the synchronized BTI signal and providing an intermediate BTI signal when the count reaches a threshold wherein the BTI pulse signal is based on the intermediate BTI signal.

10. The method of claim 9, further comprising passing the periodic BTI signal to a data path if the memory is in the unclocked mode.

11. A method comprising:
generating a periodic bias temperature instability (BTI) signal;
determining if a memory is in an unclocked mode;
passing the periodic BTI signal to a clock input buffer if the memory is in the unclocked mode;
generating a BTI pulse signal based on the periodic BTI signal with a BTI logic circuit if the memory is not in an unclocked mode;
gating a clock signal to a clock path based on the BTI pulse signal;
synchronizing the periodic BTI signal to the clock signal to generate a synchronized BTI signal, wherein the BTI pulse signal is based on the synchronized BTI signal;
generating a BTI edge detection signal each time the synchronized BTI signal changes levels; and
providing an intermediate BTI signal with a pulse extender based on the BTI edge detection signal, wherein the BTI pulse signal is based on the intermediate BTI signal.

12. The method of claim 9, further comprising suppressing the operation of the BTI logic circuit when the memory is in the unclocked mode.

13. The method of claim 9, further comprising providing the periodic BTI signal as a clock signal to a clock path when the memory is in the unclocked mode.

14. An apparatus comprising:
a clock input buffer configured to provide an input signal as a clock signal;
a clock gating circuit configured to provide the clock signal when activated;
an oscillator circuit configured to provide a periodic bias temperature instability (BTI) signal;
a clock toggle logic circuit configured to provide the periodic BTI signal as the input signal of the clock input buffer when a mode signal is active, wherein the mode signal is active when the apparatus is in an unclocked mode; and
a BTI logic circuit configured to provide a BTI pulse signal based on the periodic BTI signal when the apparatus is not in an unclocked mode, wherein the BTI pulse signal is configured to activate the clock gating circuit.

15. The apparatus of claim 14, further comprising:
a second clock toggle logic circuit configured to provide the BTI pulse signal at an active level when the apparatus is in the unclocked mode.

16. The apparatus of claim 14, further comprising:
another clock toggle logic circuit configured to provide the periodic BTI signal to a data path when the apparatus is in the unclocked mode.

17. The apparatus of claim 14, wherein the BTI logic circuit is configured to provide the BTI pulse signal synchronized to the clock signal.

18. The apparatus of claim 14, wherein the BTI logic circuit is configured to provide the BTI pulse signal after a number of activations of the periodic BTI signal.

19. The apparatus of claim 14, wherein the BTI logic circuit is configured to provide the BTI pulse signal with a pulse width based on a number of periods of the clock signal.

* * * * *

UNITED STATES PATENT AND TRADEMARK OFFICE
CERTIFICATE OF CORRECTION

PATENT NO. : 11,967,358 B2
APPLICATION NO. : 17/825600
DATED : April 23, 2024
INVENTOR(S) : Yoshiya Komatsu and Yutaka Uemura It is certified that error appears in the above-identified patent and that said Letters Patent is hereby corrected as shown below:

In the Claims

| Column | Line | Claim | Reads | Should Read |
|---|---|---|---|---|
| 15 | 21 | 1 | internal dock signal asynchronous a clock signal; | internal dock signal asynchronous to a clock signal; |
| 15 | 40 | 2 | wherein the BTI logic circuit, is configured | wherein the BTI logic circuit is configured |
| 15 | 52 | 4 | wherein the MI pulse signal is based | wherein the BTI pulse signal is based |
| 15 | 60 | 5 | based, at least in part on the intermediate MI signal. | based, at least in part on the intermediate BTI signal. |
| 16 | 10 | 6 | to provide the BIT pulse signal at the active level | to provide the BTI pulse signal at the active level |
| 16 | 37 | 9 | when the count reaches a threshold wherein the BTI pulse signal | when the count reaches a threshold, wherein the BTI pulse signal |

Signed and Sealed this
Second Day of July, 2024

Katherine Kelly Vidal
*Director of the United States Patent and Trademark Office*